(12) United States Patent
Witters et al.

(10) Patent No.: US 9,972,622 B2
(45) Date of Patent: May 15, 2018

(54) METHOD FOR MANUFACTURING A CMOS DEVICE AND ASSOCIATED DEVICE

(71) Applicant: IMEC VZW, Leuven (BE)

(72) Inventors: Liesbeth Witters, Lubbeek (BE); Anabela Veloso, Leuven (BE)

(73) Assignee: IMEC VZW, Leuven (BE)

( * ) Notice: Subject to any disclaimer, the term of this patent is extended or adjusted under 35 U.S.C. 154(b) by 34 days.

(21) Appl. No.: 15/152,700

(22) Filed: May 12, 2016

(65) Prior Publication Data
US 2016/0336317 A1   Nov. 17, 2016

(30) Foreign Application Priority Data

May 13, 2015 (EP) .................................. 15167598

(51) Int. Cl.
| | | |
|---|---|---|
| *H01L 27/092* | (2006.01) | |
| *H01L 29/165* | (2006.01) | |
| *H01L 29/06* | (2006.01) | |
| *H01L 29/78* | (2006.01) | |
| *H01L 21/8238* | (2006.01) | |

(52) U.S. Cl.
CPC .... *H01L 27/092* (2013.01); *H01L 21/823807* (2013.01); *H01L 21/823821* (2013.01); *H01L 21/823885* (2013.01); *H01L 27/0924* (2013.01); *H01L 29/0649* (2013.01);
(Continued)

(58) Field of Classification Search
CPC . H01L 27/092; H01L 29/165; H01L 29/0676; H01L 29/7848; H01L 21/823885; H01L 21/823878; H01L 29/0649; H01L 29/1083; H01L 21/823431; H01L 27/0886;
(Continued)

(56) References Cited

U.S. PATENT DOCUMENTS

| | | |
|---|---|---|
| 7,335,545 B2 | 2/2008 | Currie |
| 7,525,154 B2 | 4/2009 | Nagano et al. |

(Continued)

OTHER PUBLICATIONS

Ye, Hui et al., "Germanium Epitaxy on Silicon", Science and Technology of Advanced Materials, vol. 15, 2014, pp. 1-9.
(Continued)

*Primary Examiner* — Mouloucoulaye Inoussa
(74) *Attorney, Agent, or Firm* — McDonnell Boehnen Hulbert & Berghoff LLP

(57) ABSTRACT

A method for manufacturing a CMOS device includes providing a semiconductor base layer epitaxially growing a germanium layer on the semiconductor base layer, the germanium layer having thickness above a critical thickness such that an upper portion of the germanium layer is strain relaxed. The method also includes performing an anneal step, thinning the germanium layer and patterning the germanium layer into fin structures or into vertical wire structures. The method further includes laterally embedding the fin structures or vertical wire structures in a dielectric layer and providing a masking layer covering the first region, leaving the second region exposed. The method yet further includes selectively removing the fin structure or vertical wire structure in the second region up until the main upper surface, resulting in a trench and growing a protrusion in the trench by epitaxially growing one or more semiconductor layers in the trench.

19 Claims, 2 Drawing Sheets

(52) U.S. Cl.
CPC ........ *H01L 29/0676* (2013.01); *H01L 29/165* (2013.01); *H01L 29/7848* (2013.01)

(58) Field of Classification Search
CPC ........... H01L 29/66545; H01L 27/0924; H01L 21/0245
USPC ...... 257/79, 19, E29.049, E29.056, E29.248
See application file for complete search history.

(56) References Cited

U.S. PATENT DOCUMENTS

| | | |
|---|---|---|
| 7,586,153 B2 | 9/2009 | Hoentschel et al. |
| 8,361,868 B2 | 1/2013 | Clifton |
| 9,514,995 B1* | 12/2016 | Fogel .............. H01L 21/823878 |
| 2012/0129308 A1 | 5/2012 | Hoentschel et al. |
| 2014/0011328 A1 | 1/2014 | Bedell et al. |
| 2015/0024573 A1* | 1/2015 | Jacob ................ H01L 29/66628 438/424 |
| 2016/0133746 A1* | 5/2016 | Su .................... H01L 29/66795 438/283 |

OTHER PUBLICATIONS

Gupta, Suyog et al., "A Group IV Solution for 7 nm FinFET CMOS: Stress Engineering Using Si, Ge and Sn", 2013 IEEE International Electron Devices Meeting, Washington DC, Dec. 9-11, 2013, pp. 26.3.1-26.3.4.

Currie, M.T. et al., "Controlling Threading Dislocation Densities in Ge on Si Using Graded SiGe Layers and Chemical-Mechanical Polishing", Applied Physics Letters, vol. 72, No. 14, Apr. 6, 1998, pp. 1718-1720.

* cited by examiner

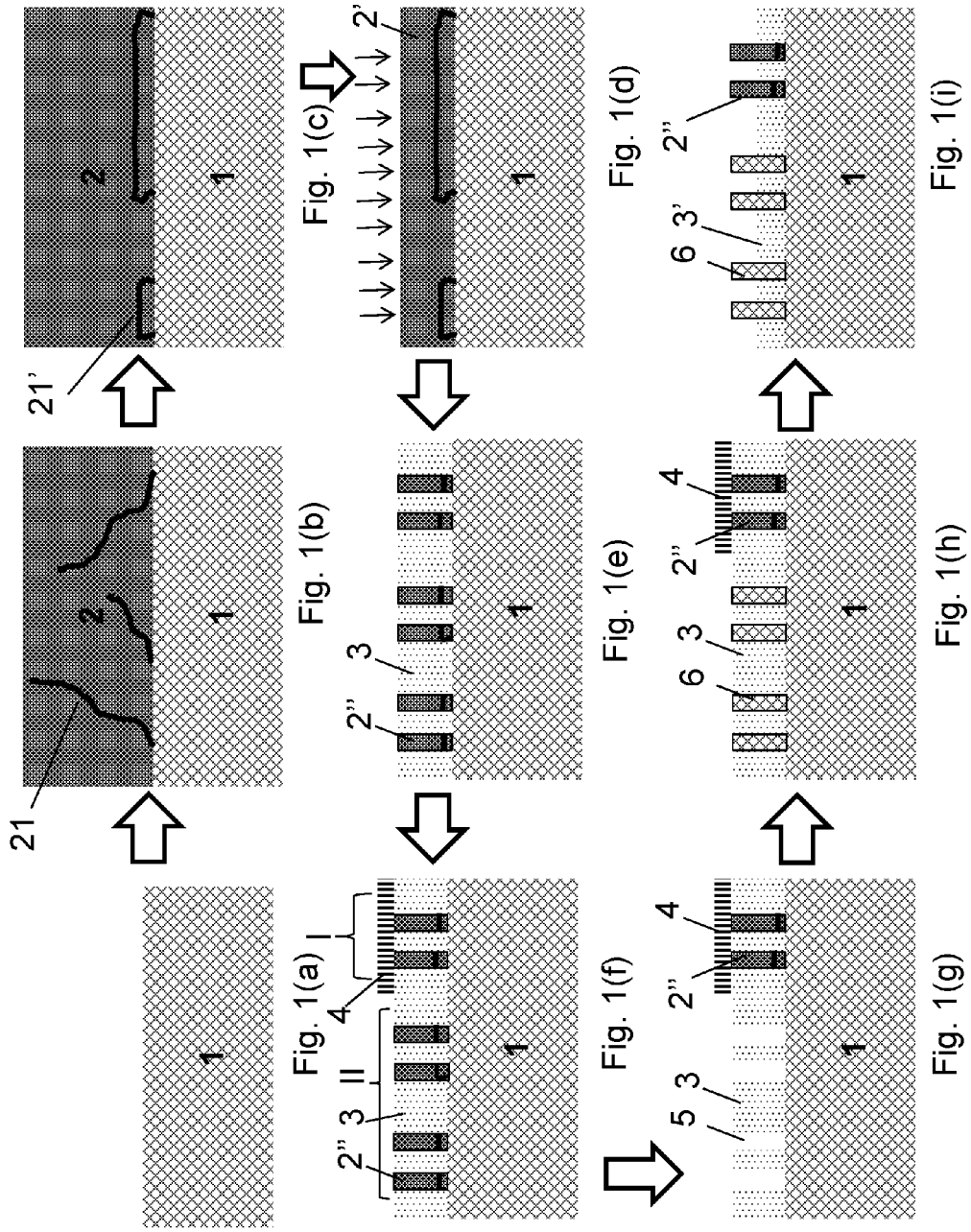

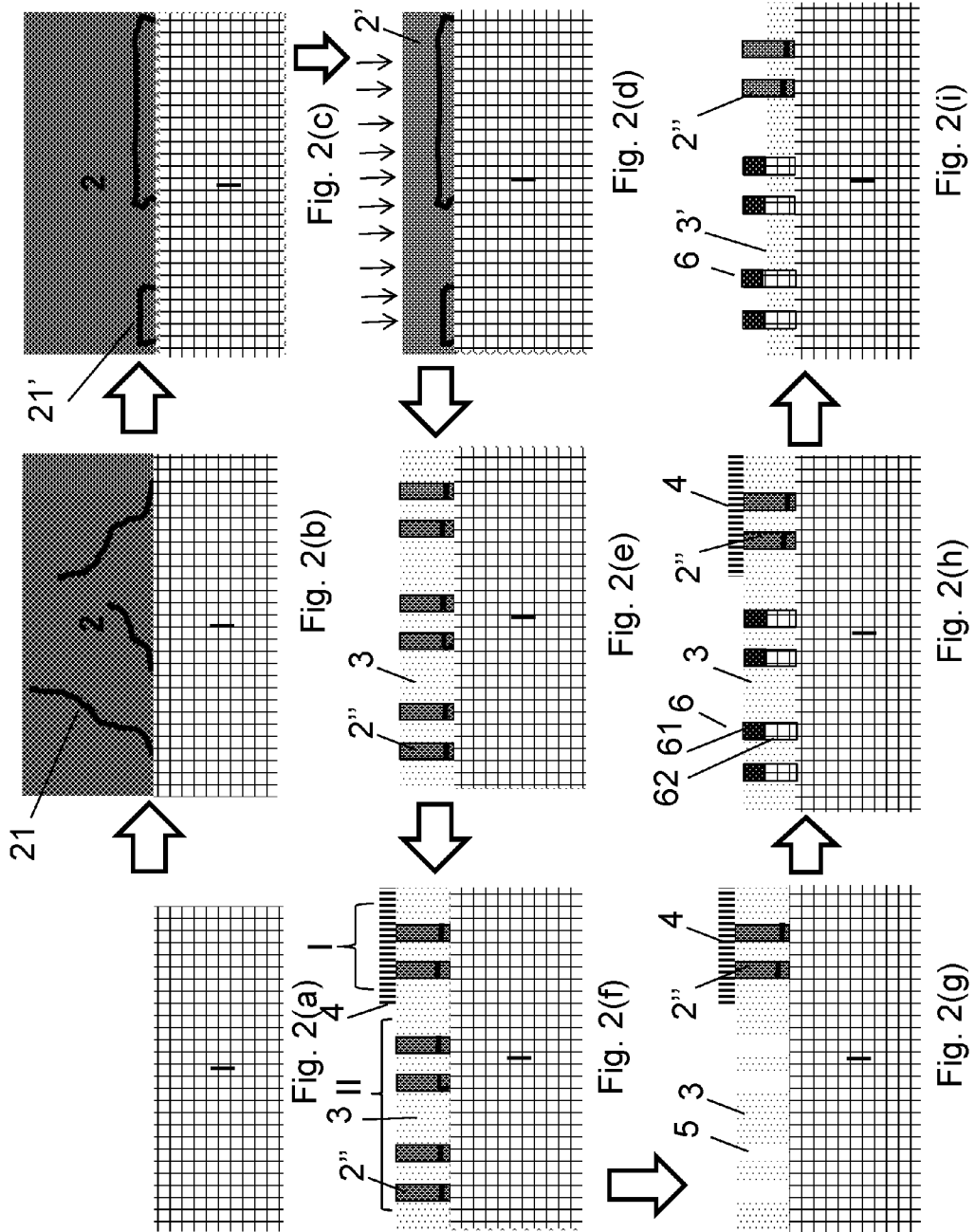

METHOD FOR MANUFACTURING A CMOS DEVICE AND ASSOCIATED DEVICE

CROSS-REFERENCE TO RELATED APPLICATIONS

The present application is a non-provisional patent application claiming priority to European Patent Application No. EP 15167598.0, filed May 13, 2015, the contents of which are hereby incorporated by reference.

FIELD OF THE DISCLOSURE

The present disclosure relates to the field of semiconductor processing. More specifically, the present disclosure relates to a method for providing CMOS devices comprising NMOS and PMOS devices, wherein NMOS and PMOS devices comprise channel materials which have a different lattice constant or wherein NMOS and PMOS devices comprise channel materials which have different strain states.

BACKGROUND

High mobility CMOS using germanium (Ge) as a channel material may utilize relaxed germanium for NMOS devices and strained germanium on a silicon germanium (SiGe) strain relaxed buffer layer for PMOS devices. It is a major technical challenge to integrate both materials together on a common substrate with low defect levels.

Some vertical nanowire or vertical FET devices utilize relaxed germanium as a channel material in PMOS devices while silicon may be used for channel material in NMOS devices.

There exists a need in industry for manufacturing methods which allow combining two different channel materials or channel strain states on a common base substrate.

SUMMARY

The present disclosure provides a method for manufacturing CMOS devices, which allows combining two different channel materials or channel strain states on a common base substrate with low defect levels, i.e. defect levels which are acceptable for manufacturing CMOS devices, such as CMOS devices manufactured in the 10 nm node technology and smaller technologies.

According to a first aspect of the present disclosure, a method for manufacturing a CMOS device is disclosed, the CMOS device comprising a first transistor structure of a first conductivity type in a first region and a second transistor structure of a second conductivity type (different from the first conductivity type) in a second region. The method includes providing a semiconductor base layer having a main upper surface. The method also includes epitaxially growing a germanium layer on the main upper surface of the semiconductor base layer. The germanium layer has a thickness above a critical thickness such that an upper portion of the germanium layer is strain relaxed (the grown germanium layer for instance having a thickness of more than 500 nm, or more than 1 micron). The method further includes performing an anneal step, which has been shown to reduce defects in the germanium layer, confining them in the lower 100 nm, or in the lower 50 nm of the germanium layer (for instance at a temperature larger than 800° C. to allow gliding of threading dislocations). The method yet further includes thinning the germanium layer. For example, the germanium layer may be thinned up until a thickness smaller then 200 nm, for instance up until a thickness of about 100 nm, for instance by chemical mechanical polishing (CMP). The method also includes patterning the germanium layer into fin structures having a longitudinal direction parallel to the main upper surface (also called "horizontal" fin/channel structures) or into vertical wire structures having a main direction perpendicular on the main upper surface (also called "vertical" wire/channel structures), thereby not affecting the semiconductor base layer. The method additionally includes laterally embedding the fin structures or vertical wire structures in a dielectric layer. The method yet further includes providing a masking layer (for instance a resist) covering the first region, leaving the second region exposed (i.e. not covering the second region, leaving the second region open) and selectively removing the fin structure or vertical wire structure in the second region up until the main upper surface, leading to the formation of a trench. The trench may expose, and/or abut, the main upper surface. The method includes growing a protrusion in the trench by growing epitaxially one or more semiconductor layers in the trench. At least an upper portion of the protrusion is adapted for (or is suitable for) being used as a channel structure of the transistor structure of a second conductivity type. An upper portion of the germanium channel structure or germanium wire structure is adapted for (or is suitable for) being used as a channel structure of the transistor structure of a first conductivity type.

Laterally embedding the fin structures or vertical wire structures in a dielectric layer, may comprise embedding in for instance a silicon oxide layer (e.g. forming Shallow Trench Isolation (STI) structures, as known to the skilled person). Laterally embedding may comprise embedding the fin structures or vertical wire structures in a dielectric layer and applying a chemical mechanical polishing step such that (an upper surface of the) fin structures or vertical wire structures is again exposed.

The conductivity type of a transistor structures is known to the skilled person, and can be for instance n-type or p-type.

The anneal step may be performed such that defects (for instance threading dislocations) are reduced in at least an upper portion of the germanium layer (e.g. an upper portion of the germanium layer prior to the thinning thereof). The anneal step may be performed such that an occurrence of defects becomes smaller in the upper portion of the germanium layer than an occurrence of defects in a lower portion of the germanium layer. In some embodiments, the anneal step may be performed such that defects are confined in a lower portion of the germanium layer. The germanium layer may be thinned to a thickness such that an occurrence of defects in said upper portion of the germanium channel structure or germanium wire structure (i.e. formed during the patterning of the germanium layer and being adapted or suitable for being used as the channel structure of the transistor structure of the first conductivity type) is smaller than an occurrence of defects in a lower portion of the germanium layer.

According to example embodiments, patterning the germanium layer may include patterning the germanium layer into fin structures, the method thus leading to a fin-type protrusion and a germanium fin structure. The method also includes selectively removing the masking layer and thinning, i.e. recessing the dielectric layer uniformly or substantially uniformly (for instance by wet or vapor based HF), such that the upper portion of the protrusion, and the upper portion of the germanium fin structures protrude from the recessed dielectric layer. The upper portion of the protrusion and the upper portion of the germanium fin structures define channels (or channel regions) of the transistor structure of a first conductivity type and the transistor structure of a second conductivity type.

According to some embodiments, the method further comprises, providing source and drain structures or regions to the channels.

According to example embodiments, the semiconductor base layer includes silicon germanium (SiGe), the protrusion includes a first, lower layer (lower portion) comprising SiGe and a second, upper layer (the upper portion), comprising strained germanium. The strained germanium upper portion corresponds to the channel region of the respective transistor. In some embodiments, the lower portion is the portion of the fin structure below the upper portion. The silicon germanium base layer can, for instance, be provided on a silicon substrate. In such a scenario, the transistor of the first conductivity type is of the NMOS type and the transistor of the second conductivity type is of the PMOS type.

According to alternative embodiments, the method may include patterning the germanium layer into vertical wire structures, which may lead to a vertical wire protrusion and a vertical germanium wire structure defining vertical channel structures/channels. Such a method may include providing source and drain structures to the vertical channel structures/channels. Providing one of the source and drain structures may include recessing, e.g. fully removing, the dielectric layer in a region adjacent to a lower end of the vertical wire structure and/or protrusion, thereby providing a recess. The method may also include providing a doped oxide layer in the recess, the oxide layer comprising dopants (hereby the doped oxide layer is brought in physical contact with the lower end of the wire channel structure). The method may include providing a temperature step adapted for inducing diffusion of the dopants from the doped oxide layer toward and into the lower end of the vertical wire structure.

According to example embodiments, the semiconductor base layer includes a silicon substrate, and the protrusion includes silicon. In such a scenario, the transistor of the first conductivity type is of the PMOS type, the transistor of the second conductivity type is of the NMOS type.

According to some embodiments, the fin structures or vertical wire structures have a width smaller than 10 nm.

According to a second aspect of the present disclosure, a CMOS device is described. The CMOS devices includes a first transistor structure of a first conductivity type in a first region and a second transistor structure of a second conductivity type in a second region. The first transistor structure and the second transistor structure may both include a fin structure. Alternatively, both transistor structures may include a vertical wire structure. In such scenarios, the fin structures or the vertical wire structures of the first and the second transistor structures may abut a common main surface of a planar semiconductor base layer. In some embodiments, respective lower portions of the fin or vertical wire structures include different materials, especially materials with different lattice constants. In some embodiments, the upper portions, that is the portions above the lower portion may include materials with different lattice constants.

According to example embodiments, the semiconductor base layer includes SiGe (e.g. a SiGe layer on a silicon substrate), the first transistor structure and the second transistor structure both comprise a fin structure, the fin structure of the first transistor structure includes or consists of germanium (which may be strain relaxed), and the fin structure of the second transistor structure includes a first, lower layer comprising SiGe and a second, upper layer, including or consisting of germanium (which may be strained germanium).

According to other example embodiments, the semiconductor base layer comprises silicon (silicon substrate), the first transistor structure and the second transistor structure both comprise a vertical wire structure, the vertical wire structure of the first transistor structure consists of germanium (strain relaxed), and the vertical wire structure of the second transistor structure comprises silicon (strain relaxed).

Features and advantages described for one of the above aspects of the present disclosure are hereby also implicitly disclosed the other aspects, mutatis mutandis, as the skilled person will recognize.

Certain objects and advantages of various inventive aspects have been described herein above. It is understood that this summary is merely an example and is not intended to limit the scope of the disclosure. The disclosure, both as to organization and method of operation, together with features and advantages thereof, may best be understood by reference to the following detailed description when read in conjunction with the accompanying drawings.

BRIEF DESCRIPTION OF THE FIGURES

The disclosure will be further elucidated by means of the following description and the appended figures.

FIGS. 1(a) through 1(i) illustrate a manufacturing process flow according to an example embodiment of the present disclosure.

FIGS. 2(a) through 2(i) illustrate a manufacturing process flow according to an example embodiment of the present disclosure.

DETAILED DESCRIPTION

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the disclosure.

Furthermore, the terms first, second, third and the like in the description and in the claims, are used for distinguishing between similar elements and not necessarily for describing a sequential or chronological order. The terms are interchangeable under appropriate circumstances and the embodiments of the disclosure can operate in other sequences than described or illustrated herein.

Moreover, the terms top, bottom, over, under and the like in the description and the claims are used for descriptive purposes and not necessarily for describing relative positions. The terms so used are interchangeable under appropriate circumstances and the embodiments of the disclosure described herein can operate in other orientations than described or illustrated herein.

Furthermore, the various embodiments, although referred to as "preferred" are to be construed as exemplary manners in which the disclosure may be implemented rather than as limiting the scope of the disclosure.

FIGS. 1(a) through 1(i) illustrate a process flow according to an embodiment of the present disclosure.

A silicon base layer (e.g a silicon substrate) 1 is provided (FIG. 1(a)). A strain relaxed germanium layer 2 is grown on top of a main surface of the silicon substrate 1. This is achieved by growing the germanium layer above a critical thickness, a thickness at which lattice defects are formed, as is known to the skilled person. Indeed, when the thickness is below the critical thickness the lattice mismatch can be compensated by biaxial strain and the top portion will be misfit free. As the film thickness grows above the critical thickness, dislocation defects start to form which lead to relaxation of the layer (by means of relaxed epitaxy) and the film will grow with its natural lattice constant. The critical thickness typically depends on the nature of the substrate on which the growth is performed. These mechanisms are known to the skilled person as for instance in Hui Ye et al., "Germanium epitaxy on silicon", Sci. Technol. Adv. Mater. 15 (2014) 024601. Hereby defects are introduced, for instance threading dislocation defects 21 (FIG. 1(b)). A high density of threading dislocations can degrade device performance. Applying a suitable anneal step allows to confine the defects 21' into the lower portion of the germanium layer 2 (FIG. 1 (c)), being a lower sublayer of about 100 nm. For example, most defects may be confined within the first 50 nm of the germanium layer 2. Some embodiments are configured to confine the defects; i.e. threading dislocations, because their presence in the channel structures and/or the channel regions has an adverse effects on the device performance. By the proposed anneal process, these defects are pushed as low as possible in this Ge layer. When the Ge layer is further thinned, as described below, such that when the upper portion of the Ge layer is thinned down, the channel is substantially free of these defects. A uniform thinning step is now applied (for instance by chemical mechanical polishing (CMP)), reducing the thickness of the germanium layer 2' uniformly, for instance in order to define the channel height, for instance up until a thickness smaller than 200 nm, or smaller than 150 nm, or smaller than 100 nm, and ending up with a planar surface (FIG. 1(d)). The germanium layer 2' is then patterned so as to include vertical wire structures having a main direction perpendicular to the main upper surface of the base layer 1. These vertical wire structures 2" are then embedded laterally in a dielectric material, e.g. a dielectric layer 3, for instance embodied as STI structures 3 which may include silicon oxide (SiO2) (FIG. 1 (e)). The lateral embedding may, for instance, include a full embedding followed by a chemical mechanical polishing step. In a first region I, the vertical wire structures 2" are being protected by providing a masking layer 4 (FIG. 1(f)). In the second region II, the vertical wire structures are left exposed (not covered by masking layer 4). Then, the vertical wire structure 2" in the second region II is selectively removed, up until the main upper surface of the base layer 1, resulting in a trench 5 (FIG. 1(g)). A protrusion 6 (in the form of a vertical wire structure) is then grown in the trench 5 by epitaxially growing a silicon layer in the trench 5, on the underlying silicon surface of the base layer 1 (FIG. 1(h)). Furthermore, the masking layer 4 is removed and the dielectric material, e.g. a dielectric layer 3, is partly etched back to have the protrusion 6 extending above the exposed surface of the dielectric material (FIG. 1(i)).

The silicon (thus also its upper portion) of the protrusion 6 is adapted for being used as a channel structure of a NMOS transistor structure and the germanium vertical wire structure (thus also an upper portion thereof) is adapted for being used as a channel structure of a PMOS transistor structure.

Further, source and drain structures can be provided to the vertical channels, the step of providing one of the source and drain structures comprising:

recessing, and in some embodiments fully removing, the dielectric layer in a region adjacent to a lower end of the vertical wire structure/protrusion, thereby providing a recess;

providing a doped oxide layer in the recess, the oxide layer comprising dopants (hereby the doped oxide layer is brought in physical contact with a lower end of the vertical wire structure); and providing a temperature step adapted for inducing diffusion of the dopants from the doped oxide layer toward and into the lower end of the vertical wire structure/protrusion.

FIGS. 2 (a) to 2 (h) illustrate a process flow according to a second embodiment of the present disclosure.

A silicon germanium base layer (e.g. provided on a silicon substrate) 1 is provided (FIG. 2(a)). A strain relaxed germanium layer 2 is grown on top of a main surface of the silicon germanium base layer 1. This is achieved by growing the germanium layer above a critical thickness, a thickness at which lattice defects are formed, as is known to the skilled person. Hereby defects are introduced, for instance threading dislocation defects 21 (FIG. 2(b)). By applying a suitable anneal step the defects 21' may be confined into the lower portion of the germanium layer 2 (FIG. 2 (c)), being a lower sublayer of about 100 nm. Most defects are confined within the first 50 nm of the germanium layer 2. A uniform thinning step is applied, reducing the thickness of the germanium layer 2' uniformly, for instance up until a thickness smaller than 200 nm, or smaller than 150 nm, or smaller than 100 nm (FIG. 2(d)). This is similar and has the same reasons as explained for the embodiment described in relation with FIG. 1. The germanium layer 2' is then patterned into channel structures 2" having a longitudinal direction parallel to the main upper surface of the base layer 1. These fin structures 2" are then embedded laterally in a dielectric material, e.g. a dielectric layer 3, for instance embodied as STI structures 3 which typically comprise silicon oxide (SiO2) (FIG. 2 (e)). In a first region I, the fin structures 2" are being protected by providing a masking layer 4 (FIG. 2(f)). In the second region II, the fin structures are left exposed (not covered by layer 4). Then, the fin structure 2" is selectively removed in the second region II, up until the main upper surface of the SiGe base layer 1, resulting in a trench 5 (FIG. 2(g)). A protrusion 6 is then grown in the trench 5 by epitaxially growing a (for instance graded) strain relaxed silicon germanium buffer layer 62 in the trench 5, on the underlying silicon surface of the base layer 1 (FIG. 2(h)). A further strained germanium layer 61 is then grown on top of the silicon germanium buffer layer 62, within the trench. This can be performed by methods known to the skilled person, as for instance illustrated in M. T. Currie, "Controlling threading dislocation densities in the Ge on Si using graded SiGe layers and chemical-mechanical polishing", Applied Physics Letters 72, 1718 (1998). Finally the masking layer 4 is removed and the dielectric material, e.g. a dielectric layer 3, is partly etch back to have the protrusion 6 extending above the exposed surface of the dielectric material (FIG. 2(i)).

The upper portion of the protrusion 6, i.e. the strained germanium layer 61 is adapted for being used as a channel structure or region of a PMOS transistor structure and an upper portion of the strain relaxed germanium channel structure or germanium wire structure 2" is adapted for being used as a channel structure of a NMOS transistor structure. The respective lower portions are the portions below the channel structures, forming the basis of the respective fin structures.

Afterwards, an etch-back process can be performed of the dielectric layer, such that the upper portion (a portion suitable for being used as channel structures/channels of respective transistor structures) of the fin structures and protrusion 6 protrude from the dielectric layer. Source and drain structures or regions can then be applied to the channels. The skilled person knows which height the channels/channel structures should have as a function of the technology node under consideration. Typically, the channel height is a function of the channel width, which corresponds to the width of the fin structures.

While the above detailed description has shown, described, and pointed out various features as applied to various embodiments, it will be understood that various omissions, substitutions, and changes in the form and details of the device or process illustrated may be made by those skilled in the technology without departing from the disclosed concepts.

The invention claimed is:

1. A method for manufacturing a CMOS device, the CMOS comprising a first transistor structure of a first conductivity type in a first region and a second transistor structure of a second conductivity type in a second region, the method comprising:
   providing a semiconductor base layer having a main upper surface;
   epitaxially growing a germanium layer on the main upper surface of the semiconductor base layer, the germanium layer having thickness above a critical thickness such that an upper portion of the germanium layer is strain relaxed;
   performing an anneal step;
   thinning the germanium layer;
   patterning the germanium layer into fin structures having a longitudinal direction parallel to the main upper surface or into vertical wire structures having a main direction perpendicular on the main upper surface;
   laterally embedding the fin structures or vertical wire structures in a dielectric layer;
   providing a masking layer covering the first region, leaving the second region exposed;
   selectively removing the fin structure or vertical wire structure in the second region up until the main upper surface, resulting in a trench; and
   growing a protrusion in the trench by epitaxially growing one or more semiconductor layers in the trench, wherein at least an upper portion of the protrusion is suitable for being used as a channel structure of the transistor structure of a second conductivity type and wherein at least an upper portion of the germanium fin structure or germanium wire structure is suitable for being used as a channel structure of the transistor structure of a first conductivity type,
   wherein the anneal step is performed prior to thinning the germanium layer.

2. The method according to claim 1, wherein patterning the germanium layer comprises patterning the germanium layer into fin structures, the method thus leading to a fin-type protrusion and a germanium fin structure, further comprising:
   selectively removing the masking layer; and
   recessing the dielectric layer uniformly such that the upper portion of the protrusion, and the upper portion of the germanium fin structures protrude from the recessed dielectric layer, the upper portion of the protrusion, and the upper portion of the germanium fin structures defining channels of the transistor structure of a first conductivity type and the transistor structure of a second conductivity type.

3. The method according to claim 2, further comprising thereafter providing source and drain regions to the channels.

4. The method according claim 1, wherein the semiconductor base layer comprises silicon germanium, and wherein the protrusion comprises a first layer comprising SiGe and a second, upper layer, comprising strained germanium.

5. The method according to claim 1, wherein the semiconductor base layer comprises a silicon substrate, and wherein the protrusion comprises silicon.

6. The method according to claim 1, wherein the fin structures or vertical wire structures comprise a width smaller than 10 nm.

7. The method of claim 1, wherein the anneal step is performed on an unpatterned germanium layer.

8. The method of claim 1, wherein patterning the germanium layer into fin structures is performed after thinning the germanium layer.

9. The method of claim 1, wherein the critical thickness comprises a thickness at which lattice defects form in the germanium layer during the epitaxial growth step.

10. A method for manufacturing a CMOS device, the CMOS comprising a first transistor structure of a first conductivity type in a first region and a second transistor structure of a second conductivity type in a second region, the method comprising:
    providing a semiconductor base layer having a main upper surface;
    epitaxially growing a germanium layer on the main upper surface of the semiconductor base layer, the germanium layer having thickness above a critical thickness such that an upper portion of the germanium layer is strain relaxed;
    performing an anneal step;
    thinning the germanium layer;
    patterning the germanium layer into fin structures having a longitudinal direction parallel to the main upper surface or into vertical wire structures having a main direction perpendicular on the main upper surface;
    laterally embedding the fin structures or vertical wire structures in a dielectric layer;
    providing a masking layer covering the first region, leaving the second region exposed;
    selectively removing the fin structure or vertical wire structure in the second region up until the main upper surface, resulting in a trench; and
    growing a protrusion in the trench by epitaxially growing one or more semiconductor layers in the trench, wherein at least an upper portion of the protrusion is suitable for being used as a channel structure of the transistor structure of a second conductivity type and wherein at least an upper portion of the germanium fin structure or germanium wire structure is suitable for being used as a channel structure of the transistor structure of a first conductivity type,
    wherein the anneal step is performed on an unpatterned germanium layer.

11. The method according to claim 1, wherein patterning the germanium layer comprises patterning the germanium layer into fin structures, the method thus leading to a fin-type protrusion and a germanium fin structure, further comprising:

selectively removing the masking layer; and recessing the dielectric layer uniformly such that the upper portion of the protrusion, and the upper portion of the germanium fin structures protrude from the recessed dielectric layer, the upper portion of the protrusion, and the upper portion of the germanium fin structures defining channels of the transistor structure of a first conductivity type and the transistor structure of a second conductivity type.

12. The method according to claim 11, further comprising thereafter providing source and drain regions to the channels.

13. The method according claim 10, wherein the semiconductor base layer comprises silicon germanium, and wherein the protrusion comprises a first layer comprising SiGe and a second, upper layer, comprising strained germanium.

14. The method according to claim 10, wherein the semiconductor base layer comprises a silicon substrate, and wherein the protrusion comprises silicon.

15. A method for manufacturing a CMOS device, the CMOS comprising a first transistor structure of a first conductivity type in a first region and a second transistor structure of a second conductivity type in a second region, the method comprising:

providing a semiconductor base layer having a main upper surface;

epitaxially growing a germanium layer on the main upper surface of the semiconductor base layer, the germanium layer having thickness above a critical thickness such that an upper portion of the germanium layer is strain relaxed;

performing an anneal step;

thinning the germanium layer;

patterning the germanium layer into fin structures having a longitudinal direction parallel to the main upper surface or into vertical wire structures having a main direction perpendicular on the main upper surface;

laterally embedding the fin structures or vertical wire structures in a dielectric layer;

providing a masking layer covering the first region, leaving the second region exposed;

selectively removing the fin structure or vertical wire structure in the second region up until the main upper surface, resulting in a trench; and growing a protrusion in the trench by epitaxially growing one or more semiconductor layers in the trench, wherein at least an upper portion of the protrusion is suitable for being used as a channel structure of the transistor structure of a second conductivity type and wherein at least an upper portion of the germanium fin structure or germanium wire structure is suitable for being used as a channel structure of the transistor structure of a first conductivity type, wherein patterning the germanium layer into fin structures is performed after thinning the germanium layer.

16. The method according to claim 15, wherein patterning the germanium layer comprises patterning the germanium layer into fin structures, the method thus leading to a fin-type protrusion and a germanium fin structure, further comprising:

selectively removing the masking layer; and recessing the dielectric layer uniformly such that the upper portion of the protrusion, and the upper portion of the germanium fin structures protrude from the recessed dielectric layer, the upper portion of the protrusion, and the upper portion of the germanium fin structures defining channels of the transistor structure of a first conductivity type and the transistor structure of a second conductivity type.

17. The method according to claim 16, further comprising thereafter providing source and drain regions to the channels.

18. The method according claim 15, wherein the semiconductor base layer comprises silicon germanium, and wherein the protrusion comprises a first layer comprising SiGe and a second, upper layer, comprising strained germanium.

19. The method according to claim 15, wherein the semiconductor base layer comprises a silicon substrate, and wherein the protrusion comprises silicon.

* * * * *